(12) United States Patent  
Petrick

(10) Patent No.: US 6,464,373 B1  
(45) Date of Patent: Oct. 15, 2002

(54) LIGHT EMITTING DIODE LIGHTING WITH FRUSTOCONICAL REFLECTOR

(75) Inventor: John T. Petrick, New Port Richey, FL (US)

(73) Assignee: TWR Lighting, Inc., Houston, TX (US)

( * ) Notice: Subject to any disclaimer, the term of this patent is extended or adjusted under 35 U.S.C. 154(b) by 0 days.

(21) Appl. No.: 09/704,592

(22) Filed: Nov. 3, 2000

(51) Int. Cl.[7] ................................................. F21V 1/00
(52) U.S. Cl. .................... 362/235; 362/247; 340/815.45
(58) Field of Search .............................. 362/235, 247; 340/815.45, 815.75

(56) References Cited

U.S. PATENT DOCUMENTS 5,642,933 A * 7/1997 Hitora .......................... 362/243
5,838,247 A * 11/1998 Bladowski ............. 340/815.45
5,947,587 A * 9/1999 Keuper et al. ............... 362/235
6,234,648 B1 * 5/2001 Borner et al. ................ 362/235

* cited by examiner

Primary Examiner—Sandra O'Shea
Assistant Examiner—Ronald E. DelGizzi

(57) ABSTRACT

A light emitting diode lighting system comprising a plate having an exterior periphery and a central generally circular attachment zone of a reduced circumference. The plate has an upper surface with a plurality of mounting areas thereon. The mounting areas include a plurality of mounting areas in a generally circular exterior array adjacent to the exterior periphery and a generally circular interior array around the attachment zone and at least one circular intermediate arrays there between. A plurality of light emitters have light emitting upper areas and with lower areas formed with electrical leads for illuminating the upper areas with intermediate securement means there between. Each of the light emitters is secured within an associated mounting area on the plate. A reflector is in a generally truncated cone-shaped configuration with a central axis perpendicular to the plate and a generally circular smaller end of a reduced circumference positioned within the attachment zone of the circular plate and with a generally circular upper end of an enlarged circumference positioned above the plate. An intermediate surface is there between. The intermediate surface of the reflector has a continually diminishing circumference from its upper end to its lower end and is located entirely above the light emitters and with the reflector and plate having a common axis there through.

1 Claim, 5 Drawing Sheets

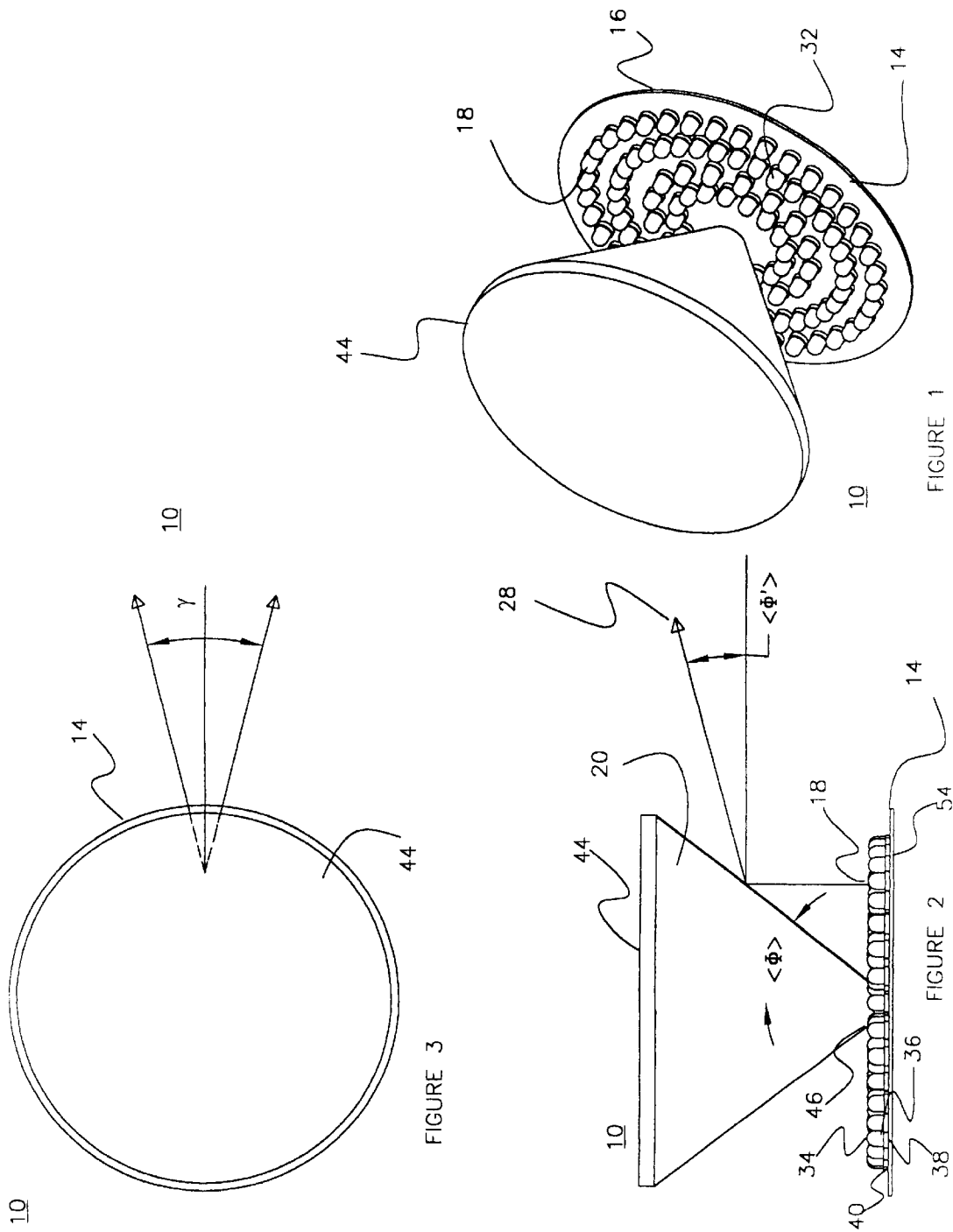

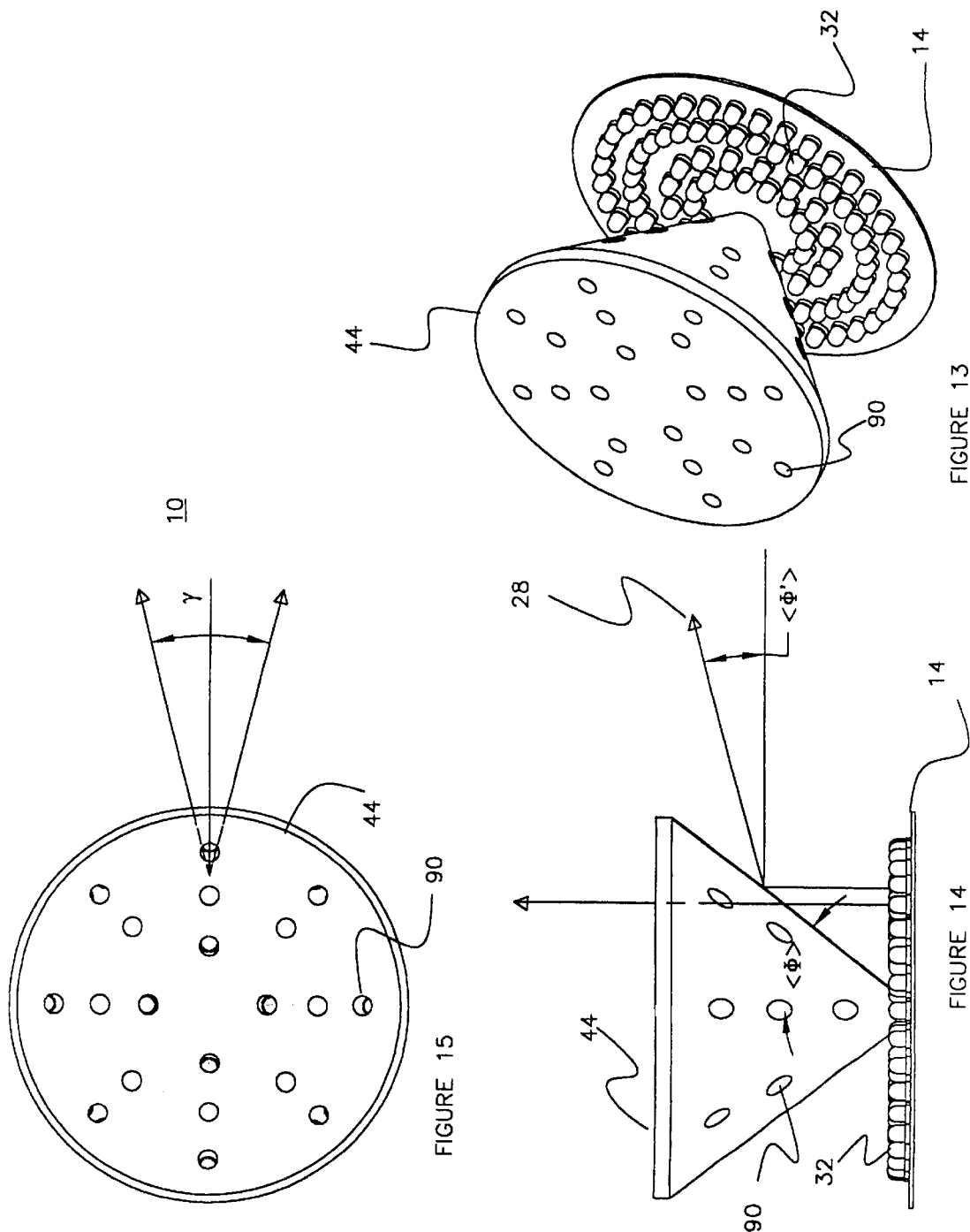

LIGHT EMITTING DIODE LIGHTING WITH FRUSTOCONICAL REFLECTOR

BACKGROUND OF THE INVENTION

1. Field of the Invention

The present invention relates to a LED warning light system and more particularly pertains to projecting light at a predetermined angle in a long life, cost effective manner.

2. Description of the Prior Art

The FAA requires that obstructions to aircraft, such as towers, cables, and tall buildings be fitted with visible elements to render these highly visible to approaching aircraft. FAA Advisory Circular AC-150/5345-43E forms the specification for these lights. Of these elements there exists a requirement for a low intensity steady burn red light system, designated the L810, to be placed in accordance with a set plan at levels on all towers potentially forming a hazard to air navigation. The L810 system generally incorporates a light source and a lensed dome directing red light into a 360 azimuth around the obstruction and within a band 10 degrees wide about a plane anywhere from 4 to 20 degrees above the horizontal. The minimum intensity of the L810 light is 32.5 candela. The conventional L810 employs an incandescent lamp appearing in bulb form having a long circular filament and a threaded base. The lensed dome comprises a red filter glass structure having a molded Fresnel outer portion and a lenticular array inner portion. The substantially white light produced by the filament is focused vertically into the 10-degree zone by the Fresnel portion and dispersed uniformly into the 360-degree zone by the lenticular array portion.

There are some LED based obstruction lights on the market, however, all of these employ a Fresnel lens and internal lenticular array to produce the requisite beam characteristics. Also, there is a requirement for a 2,000-candela flashing light designated the L864 light which is now generally satisfied with a xenon gas discharge lamp, however, an LED based L864 equivalent is available overseas, however the US version is in approval testing.

There is a need to simplify the optical systems of LED based aircraft obstruction lights and the subject invention substantially fills that need. There are additional industrial and vehicular warning light applications that can benefit from the LED warning light system invention.

The use of lighting systems of known designs and configurations is known in the prior art. More specifically, lighting systems of know designs and configurations previously devised and utilized for the purpose of projecting light through known methods and apparatuses are known to consist basically of familiar, expected, and obvious structural configurations, notwithstanding the myriad of designs encompassed by the crowded prior art which has been developed for the fulfillment of countless objectives and requirements.

While these devices fulfill their respective, particular objectives and requirements, the aforementioned prior methods and apparatuses do not describe a LED warning light system that allows projecting light at a predetermined angle in a long life, cost effective manner.

In this respect, the LED warning light system according to the present invention substantially departs from the conventional concepts and designs of the prior art, and in doing so provides an apparatus primarily developed for the purpose of projecting light at a predetermined angle in a long life, cost effective manner.

Therefore, it can be appreciated that there exists a continuing need for a LED warning light system which can be used for projecting light at a predetermined angle in a long life, cost effective manner. In this regard, the present invention substantially fulfills this need.

SUMMARY OF THE INVENTION

In view of the foregoing disadvantages inherent in the known types of lighting systems of know designs and configurations now present in the prior art, the present invention provides an improved LED warning light system. As such, the general purpose of the present invention, which will be described subsequently in greater detail, is to provide a LED warning light system which has all the advantages of the prior art and none of the disadvantages.

To attain this, the present invention essentially comprises a light emitting diode lighting system for projecting light at a predetermined angle in a long life cost effective manner. The system comprises, in combination, a circular plate which has an enlarged exterior periphery and a central circular attachment zone of a reduced circumference. The plate has an upper surface with a plurality of mounting areas there through. The mounting areas include a plurality of mounting areas in an circular exterior array adjacent to the exterior periphery and an circular interior array around the circular attachment zone and a plurality of circular intermediate arrays there between. Nest provided is a plurality of light emitting diodes. Such light emitting diodes have light emitting upper areas and lower areas formed with electrical leads for illuminating the upper areas. Intermediate securement means are located there between. Each of the light emitting diodes is secured within an associated hole on the plate. A reflector in a truncated cone-shaped configuration is next provided. It has a central axis perpendicular to the plate and a circular smaller end of a reduced circumference positioned within the circular attachment zone of the circular plate. It also has a circular upper end of an enlarged circumference at least as great as that of the plate. The upper end is positioned above the plate and parallel therewith. The reflector has an intermediate surface there between. The intermediate surface of the reflector has a continually diminishing circumference from its upper end to its lower end. It is located entirely above the light emitting diodes. The reflector and plate have a common axis there through. The surface is at an angle of between about 22 to 50 degrees from the common axis. Lastly, provided are means to apply an electrical current to the anodes and cathodes of the light emitting diodes. In this manner illumination from the upper ends of the light emitting diodes will project outwardly and also reflect from the surface of the reflector to disseminate an annular beam of the reflected light in all directions upwardly. The upwardly directed right is at between −45 and +70 degrees from the plane of the plate. The horizontal divergence is between about 2 and 120 degrees, preferably z degrees. The vertical divergence is between 2 and 46 degrees, preferably 10 degrees.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims attached.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore an object of the present invention to provide a LED warning light system which has all of the advantages of the prior art lighting systems of know designs and configurations and none of the disadvantages.

It is another object of the present invention to provide a LED warning light system which may be easily and efficiently manufactured and marketed.

It is further object of the present invention to provide a LED warning light system which is of durable and reliable constructions.

An even further object of the present invention is to provide a LED warning light system which is susceptible of a low cost of manufacture with regard to both materials and labor, and which accordingly is then susceptible of low prices of sale to the consuming public, thereby making such LED warning light system economically available to the buying public.

Even still another object of the present invention is to provide a LED warning light system for projecting light at a predetermined angle in a long life, cost effective manner.

Lastly, it is an object of the present invention to provide a light emitting diode lighting system comprising a plate having an exterior periphery and a central generally circular attachment zone of a reduced circumference. The plate has an upper surface with a plurality of mounting areas therein. The upper surface may be reflective or non-reflective. The mounting areas include a generally circular exterior array adjacent to the exterior periphery and a generally circular interior array around the attachment zone and at least one circular intermediate arrays there between. A plurality of light emitters have light emitting upper areas and with lower areas formed with electrical leads for illuminating the upper areas with intermediate securement means there between. Each of the light emitters is secured within an associated hole on the plate. A reflector is in a generally truncated cone-shaped configuration with a central axis perpendicular to the plate and a generally circular smaller end of a reduced circumference positioned within the attachment zone of the circular plate and with a generally circular upper end of an enlarged circumference positioned above the plate. An intermediate surface is there between. The intermediate surface of the reflector has a continually diminishing circumference from its upper end to its lower end and is located entirely above the light emitters and with the reflector and plate having a common axis there through.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 1 is a perspective illustration of the LED warning light system constructed in accordance with the principles of the present invention.

FIG. 2 is a side elevational view of the system shown in FIG. 1.

FIG. 3 is a plan view of the plate and light emitting diodes of the prior Figures.

FIGS. 13, 14 and 15 are perspective illustrations, a side elevational view and a plan view, similar to FIGS. 1, 2 and 3 but showing another alternate embodiment of the invention.

The same reference numerals refer to the same parts throughout the various Figures.

DESCRIPTION OF THE PREFERRED EMBODIMENT

Figure 4:
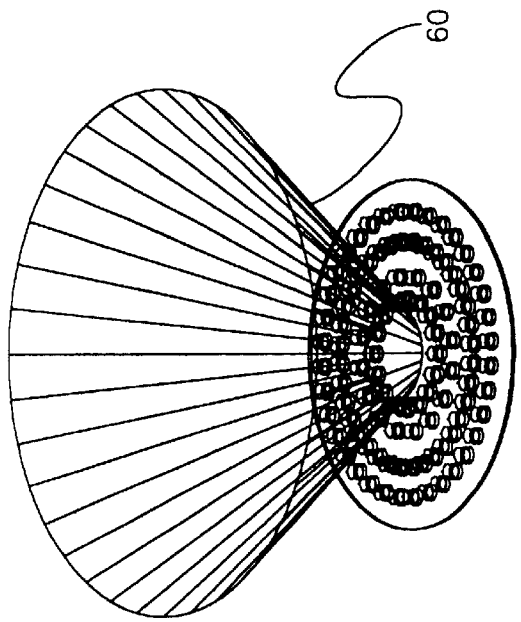
FIGS. 4, 5 and 6 are perspective illustrations, a side elevational view and a plan view, similar to FIGS. 1, 2 and 3 but showing an alternate embodiment of the invention.

With reference now to the drawings, and in particular to FIG. 1 thereof, the preferred embodiment of the LED warning light system embodying the principles and concepts of the present invention and generally designated by the reference numeral 10 will be described.

The present invention, the LED warning light system 10 is comprised of a plurality of components. Such components in their broadest context include a plate, light emitters and a reflector. Such components are individually configured and correlated with respect to each other so as to attain the desired objective.

The present invention essentially comprises a light emitting diode lighting system 10 for projecting light at a predetermined angle in a long life cost effective manner. The system comprises, in combination a circular plate 14 which has an enlarged exterior periphery 16 and a central circular attachment zone 18 of a reduced circumference. The plate has a reflective upper surface with a plurality of mounting areas there through. The mounting areas include a plurality of mounting areas in an circular exterior array adjacent to the exterior periphery and an circular interior array around the circular attachment zone and a plurality of circular intermediate arrays there between Next provided is a plurality of light emitting diodes 32. Such light emitting diodes have light emitting upper areas 34 and lower areas 36 formed with electrical leads 38 for illuminating the upper areas. Intermediate securement means 40 are located there between. Each of the light emitting diodes is secured within an associated mounting area on the plate within the attachment zones.

A reflector in a truncated cone-shaped configuration is next provided. It has a central axis perpendicular to the plate and a circular smaller end 46 of a reduced circumference positioned within the circular attachment zone of the circular plate. It also has a circular upper end 44 of an enlarged circumference at least as great as that of the plate. The upper end is positioned above the plate and parallel therewith. The reflector has an intermediate surface there between. The intermediate surface of the reflector has a continually diminishing circumference from its upper end to its lower end. It is located entirely above the light emitting diodes. The reflector and plate have a common axis there through. The surface is at an angle of between about 22 to 50 degrees from the common axis.

Lastly, provided are means 54 to apply an electrical current to the anodes and cathodes of the light emitting diodes. In this manner illumination 28 from the upper ends of the light emitting diodes will project outwardly and also reflect from the surface of the reflector to disseminate an annular beam of the reflected light in all directions upwardly. The upwardly directed light is at between minus 45 and plus 70 degrees from the plane of the plate. The horizontal divergence is between about 2 and 120 degrees. The vertical divergence is between 2 and 46 degrees, preferably 10 degrees.

As can be seen, the LED warning light system described above comprises a Light Emitting Diode (LED) light source panel, and conical reflector. See FIGS. 1, 2, and 3. LED light source panel 14 comprises a plurality of LED's and the requisite electrical wiring and electronic devices necessary to produce stable light emission from LED's. There are several possible electrical configurations ranging from having all LED's in series connection to having all LED's in parallel connection. Ideally, all LED's in parallel is recommended since the failure of one LED in the array will generally result in a small decrease in light output. In practice, however, groups of LED's are formed in series arrangements and these groups are then connected in parallel. In this manner selected input voltages are used and by judicial LED arrangement the failure of a single LED will reduce light output, but not produce a total failure. LED light source panel 12 substrate may be a conventional printed circuit board and LED's may be through hole or surface mount LED types. In a model successfully tested, a glass-resin circuit board with 88, 5 millimeter diameter, through hole, red, LED's having a beam divergence of +/−4 degrees formed LED light source panel.

The conical reflector comprises a solid or shell-like form having a reflective surface being a near perfect mirror at the red light wavelength required. The red light wavelength must fall within the FAA/ICAO spectral boundaries y=0.980−x, y=0.335, and x+y+z=1 (CIE chromaticity diagram.) LED's may not produce the required color and a filter insert may be required to maintain the spectrum within this range. Or, a protective dome, which has no lens structure, may be produced with filtering properties thereby shifting the spectrum to the desired color. A protective dome for the LED warning light system may be a simple clear or red, polycarbonate or acrylic, cylinder. LED's are preferably affixed to LED light source panel wherein the axis of each LED 32 is parallel to axis of conical reflector. The angle at which the light from LED's is redirected above or below the horizontal is then given by:

$$\Phi'=90-2*\Phi$$

Where $\Phi$=the angle the conical reflector makes with it's axis in degrees, and $\Phi'$=the angle at which light 28 emerges measured from the horizontal in degrees. In practice F=37.5 degrees to obtain output 15 degrees above the horizontal. Generally, light from an LED emerges in a cone of a fixed angle, measured to the 50% intensity point, ranging from 4-degree half angle to 60-degree half angle versions. Selection of a 4-degree half angle LED provides light in a cone 8 degrees full angle to the half intensity points. When this emergent light intercepts conical reflective surface it is redirected from reflective surface and roughly fills an 8-degree elevational angle, as if there were a plane mirror redirecting the light. However, the azimuthal reflection no longer fills 8 degrees, rather it fills a larger angle defined by an angle of incidence which is formed at a normal to the surface at impingement. This surface is a circle so the result is a greatly increased beam spread angle γ depending on the radius of curvature at the impingement point and on how far LED is removed from the impingement point. In essence, conical reflector in combination with an LED light source panel produces the same effect as the Fresnel lens and lenticular array in the prior art. The aforementioned conical reflector in combination with an LED light source panel forms the first or preferred embodiment of the LED warning light system. However, there may be circumstances/situations wherein a) the azimuthal beam spread is insufficient, or b) there is no available narrow angle LED suitable for producing a required elevational beam spread. In case a) azimuthal beam spread may be increased by introducing a secondary structure to conical reflector.

Figure 6:
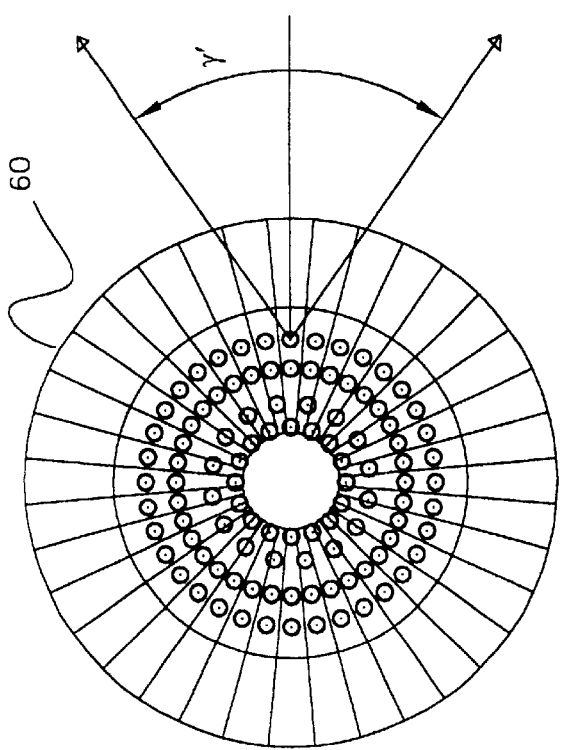
Figure 5:
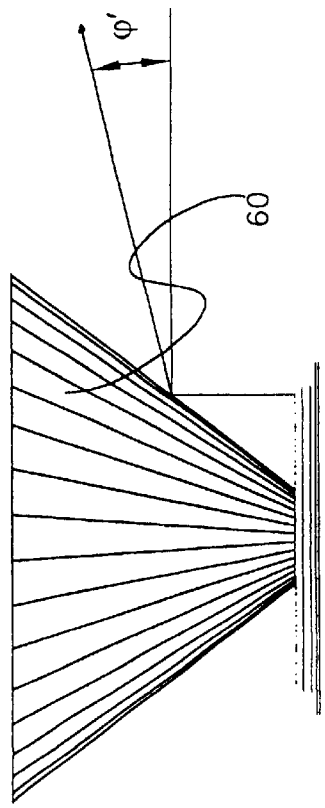

In an alternate embodiment of the invention, the second embodiment shown in FIGS. 4, 5 and 6, the secondary structure may be formed as a series of tapering cylindrical reflective portions or panels 60, either concave or convex or preferably flat, which preserve the conical reflector optical characteristics in the elevational direction, however which always present a reflective surface having a smaller radius of curvature than the radius of the original cone at any point of impingement of light from LED panel. The light reflected is thereby reflected as it was from reflector, however the smaller radii of curvature of portions provide increased azimuthal beam spread γ which may be used to "fill in" dead spots experienced when using narrow angle LED's. In case b) reflector is configured with one or more focal zones formed therein.

Figure 7:
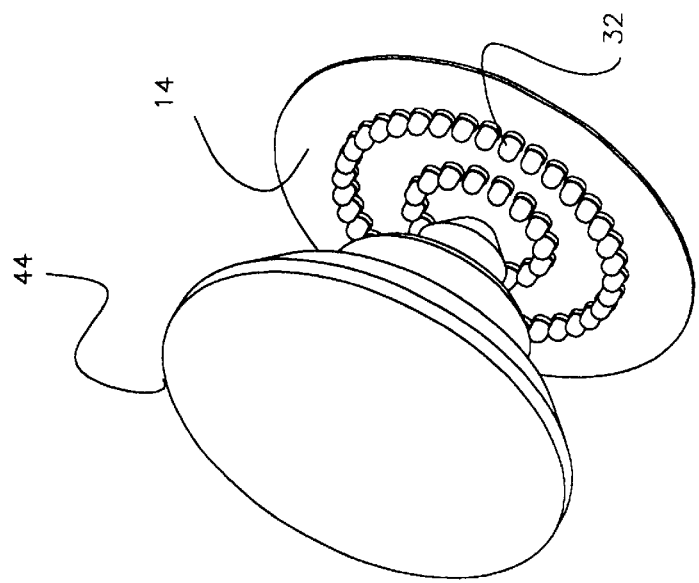
FIGS. 7, 8 and 9 are perspective illustrations, a side elevational view and a plan view, similar to FIGS. 1, 2 and 3 but showing another alternate embodiment of the invention.
Figure 9:
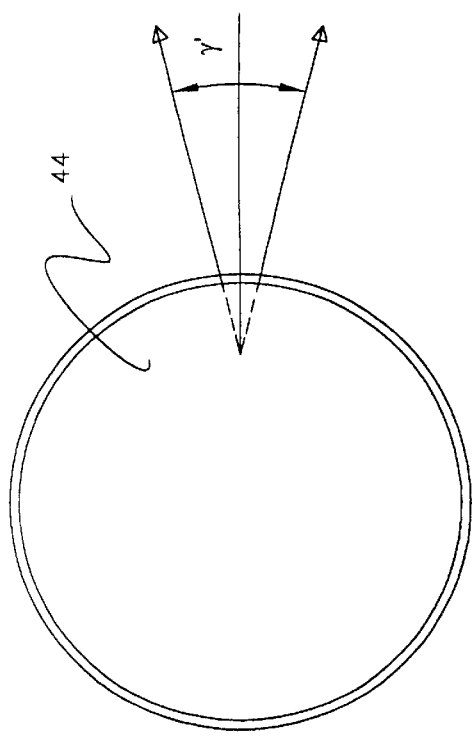
Figure 8:
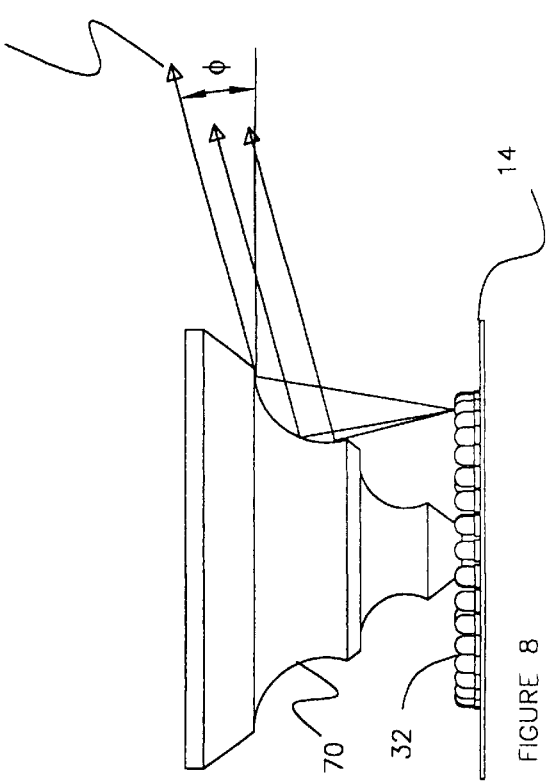

In an additional alternate embodiment, the third embodiment as shown in FIGS. 7, 8, and 9, there is shown the simplest form of focal zone which is formed with a surface 70 a parabolic cross section shape rotated about its central axis and having a propeny of collimating light from LED's disposed in a circular array as well as redirecting the light to form a narrow elevational band with a wide azimuthal beam spread γ'. This arrangement permits the use of inexpensive wide angle, high output LED's to produce a range of elevational beam spreads established primarily by the cross sectional shape of the focal zone. A further extension of case a) in combination with case b) may be made with the result being a reflector which is capable of producing the same optical effect as the Fresnel lens/lenticular array of the prior an, however without the transmissive losses of the refractive glassy dome and furthermore being susceptible to less expensive manufacture in only requiring the production of precise exterior surfaces in a molding or machining operation. Also reflectors may be formed by stamping or hydroforming, which reduces cost yet further than any prior art.

Figure 10:
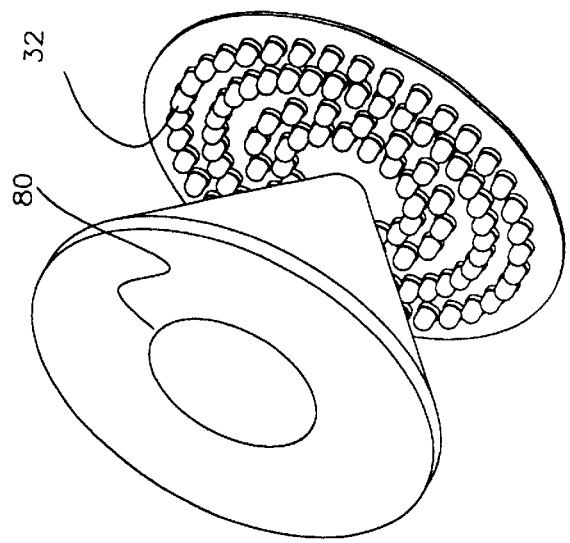
FIGS. 10, 11 and 12 are perspective illustrations, a side elevational view and a plan view, similar to FIGS. 1, 2 and 3 but showing another alternate embodiment of the invention.
Figure 12:
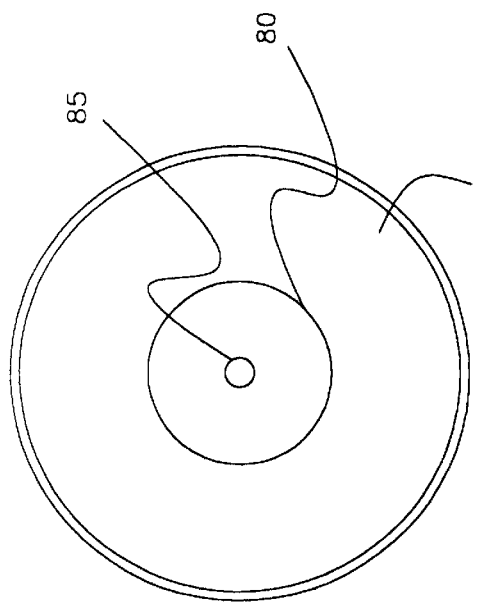
Figure 11:
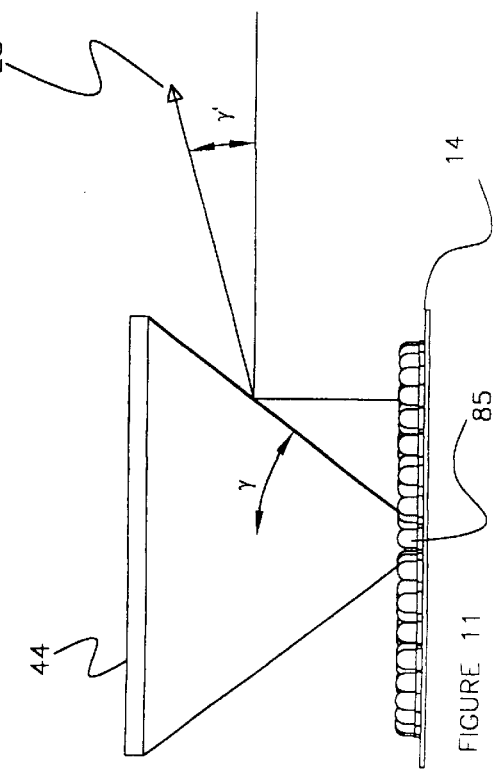

In another alternate embodiment as shown in FIGS. 10, 11 and 12, the LED warning light system comprises an LED light source panel 14, and conical reflector where the conical reflector is truncated and has a centrally disposed hole 80 there through in the upper surface 44. Furthermore, the LED light source panel has a centrally disposed LED 85 having its axis co-incident with the axis of reflector. The hole 80 may be widened to permit use of larger beam spread LED's as well as to minimize reflector weight. Light from LED is caused to pass through reflector thereby providing warning light for regions above the light. Some applications, such as required by Canadian specifications, require light to shine from the unit in a vertical and near vertical direction.

Another alternate embodiment is shown in FIGS. 13, 14 and 15. It provides for vertical light emission. Such LED warning light system comprises an LED light source panel, and conical reflector where the conical reflector has an upper surface 44 with a plurality of perforations 90 in more than one place. In this manner some light from various parts of LED light source panel passes through reflector thereby providing warning light for regions above the light.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A light emitting diode warning light system for projecting light at a predetermined angle in a long life, cost effective manner comprising, in combination:

a circular plate having an enlarged exterior periphery and a central circular attachment zone of a reduced circumference, the plate having an upper surface with a plurality of mounting areas thereon, the mounting areas including a plurality of mounting areas in a circular exterior array adjacent to the exterior periphery and a circular interior array around the circular attachment zone and a plurality of circular intermediate arrays there between;

a plurality of light emitting diodes having light emitting upper areas and with lower areas formed with electrical leads for illuminating the upper areas with intermediate securement means there between, each of the light emitting diodes being secured on the plate;

a reflector in a truncated cone-shaped configuration over essentially the entire surface of the reflector with a central axis perpendicular to the plate and a circular smaller end of a reduced circumference positioned within the circular attachment zone of the circular plate and with an circular upper end of an enlarged circumference at least as great as that of the plate positioned above the plate and parallel therewith and with an intermediate surface there between, the intermediate surface of the reflector having continually diminishing circumference from its upper end to its lower end and located entirely above the light emitting diodes and with the reflector and plate having a common axis there through and with the surface at an angle of between about 22 to 50 degrees from the common axis; and means to apply an electrical current to the anodes and cathodes of the light emitting diodes whereby illumination from the upper ends of the light emitting diodes will project outwardly and also reflect from the surface of the reflector to disseminate an annular beam of the reflected light in all directions upwardly at between −45 and +70 degrees from the plane of the plate with a horizontal divergence of between about 2 and 120 degrees, and a vertical divergence of between 2 and 46 degrees, preferably 10 degrees.

* * * * *